(12) United States Patent
Fujiwara (10) Patent No.: US 11,410,742 B1
(45) Date of Patent: Aug. 9, 2022

(54) MICROELECTRONIC DEVICE TESTING, AND RELATED DEVICES, SYSTEMS, AND METHODS

(71) Applicant: Micron Technology, Inc., Boise, ID (US)

(72) Inventor: Yoshinori Fujiwara, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/249,306

(22) Filed: Feb. 26, 2021

(51) Int. Cl.
*G11C 29/44* (2006.01)
(52) U.S. Cl.
CPC .................... *G11C 29/44* (2013.01)
(58) Field of Classification Search
CPC ....................................................... G11C 29/44
See application file for complete search history.

(56) References Cited

FOREIGN PATENT DOCUMENTS

CN 112527391 A * 3/2021 .......... G06F 11/1012

\* cited by examiner

*Primary Examiner* — Sultana Begum
(74) *Attorney, Agent, or Firm* — TraskBritt (57) ABSTRACT

Microelectronic device testing, and related methods, devices, and systems, are described herein. A device may include a memory array including a number of rows and a number of columns. The memory device may further include circuitry coupled to the memory array. The circuitry may be configured to perform a testing operation on each row of the number of rows to detect: a first fail of a first row of the number of rows; and a set of additional fails associated with a set of rows of the number of rows. The circuitry may also be configured to determine whether the set of rows is adjacent the first row. Further, in response to determining that the set of rows is adjacent the first row, the circuitry may be configured to generate a signal indicative of a failure of a column of the number of columns.

20 Claims, 10 Drawing Sheets

MICROELECTRONIC DEVICE TESTING, AND RELATED DEVICES, SYSTEMS, AND METHODS

TECHNICAL FIELD

Embodiments of the disclosure relate to microelectronic device testing. Yet more specifically, various embodiments of the disclosure relate to testing microelectronic devices via an internal testing operation, and related methods, devices, and systems.

BACKGROUND

Memory devices are typically provided as internal, semiconductor-based, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data rate memory (DDR), low-power double-data rate memory (LPDDR), phase-change memory (PCM), and Flash memory.

Memory devices typically include many memory cells that are capable of holding a charge that is representative of a bit of data. Typically, these memory cells are arranged in a memory array. Data may be written to or retrieved from a memory cell by selectively activating the memory cell via an associated word line driver.

DETAILED DESCRIPTION

A semiconductor memory device typically includes an array of memory cells. Memory cells in the array are selected for reading and writing by means of row and column address signals input to the semiconductor memory device. The row and column address signals are processed by address decoding circuitry to select row lines and column lines in the array to access a desired memory cell or memory cells.

During and/or after fabrication of integrated circuits, such as semiconductor memory devices, it is conventional to test such integrated circuits at several stages. For example, the integrated circuits may be connected to a tester with a probe card when the integrated circuits are still in wafer form. Further, after the integrated circuits have been diced and packaged, the integrated circuits may be placed into sockets on a load board. The load board is then placed on a test head, which is connected through a cable to a high-speed tester so that the tester can apply signals to and receive signals from the integrated circuits.

Furthermore, as will be appreciated by a person having ordinary skill in the art, a memory built-in self-test (also referred to as "mBIST" or "memory BIST") is configured to generate patterns in a memory device and read the patterns to log any defects. Memory BIST, which may include repair and redundancy capability, allows timely testing of a memory device with a reasonably high degree of fault coverage, without requiring continual interactive control via external test equipment. A testing algorithm used in mBIST may be implemented in embedded circuitry of the memory device. In the mBIST approach, a test pattern generator and test response analyzer are incorporated directly into the memory device to be tested. At the end of a conventional mBIST test, or "run," a simple pass/fail signal is asserted, indicating whether the memory device passed or failed the test. Intermediate pass/fail signals may also be provided, allowing individual memory locations or group of locations to be analyzed.

In conventional mBIST implementations, a failed row address is captured and row redundancy is used to repair the failed row address. Conventional mBISTs do not flag a column failure (e.g., due to the complexity and design overhead to track column failing addresses during a test sequence). If there is a column failure on a die, mBIST circuitry may send flags to test repeatedly until the column failure is fully repaired with many row redundancies. In most scenarios, if there is a true column failure, an unrepairable flag many be generated after numerous repair attempts (i.e., due to a lack of available row redundancies).

As described more fully below, various embodiments disclosed herein relate to microelectronic device testing. More specifically, various embodiments relate to detecting a column failure based on detecting (i.e., during a testing operation) a number of row failures. Stated another way, various embodiments relate to identifying, during a testing operation, a column failure in response to detection of a threshold number (e.g., 3 or 4) of failing rows (i.e., in series (i.e., relative to position)). Yet more specifically, various embodiments may include devices, systems, and methods for detecting an address of a failed row, and determining whether each row of a set of rows (e.g., a set of three (3) rows) adjacent the failed row has failed. Further, in response to determining that each row of the set of rows has failed (i.e., in addition to the failed row) a signal, indicative of a column failure, may be generated.

Although various embodiments are described herein with reference to semiconductor and/or memory devices, the present disclosure is not so limited, and the embodiments may be generally applicable to microelectronic systems and/or devices that may or may not include semiconductor devices and/or memory devices. Embodiments of the present disclosure will now be explained with reference to the accompanying drawings.

Figure 1:
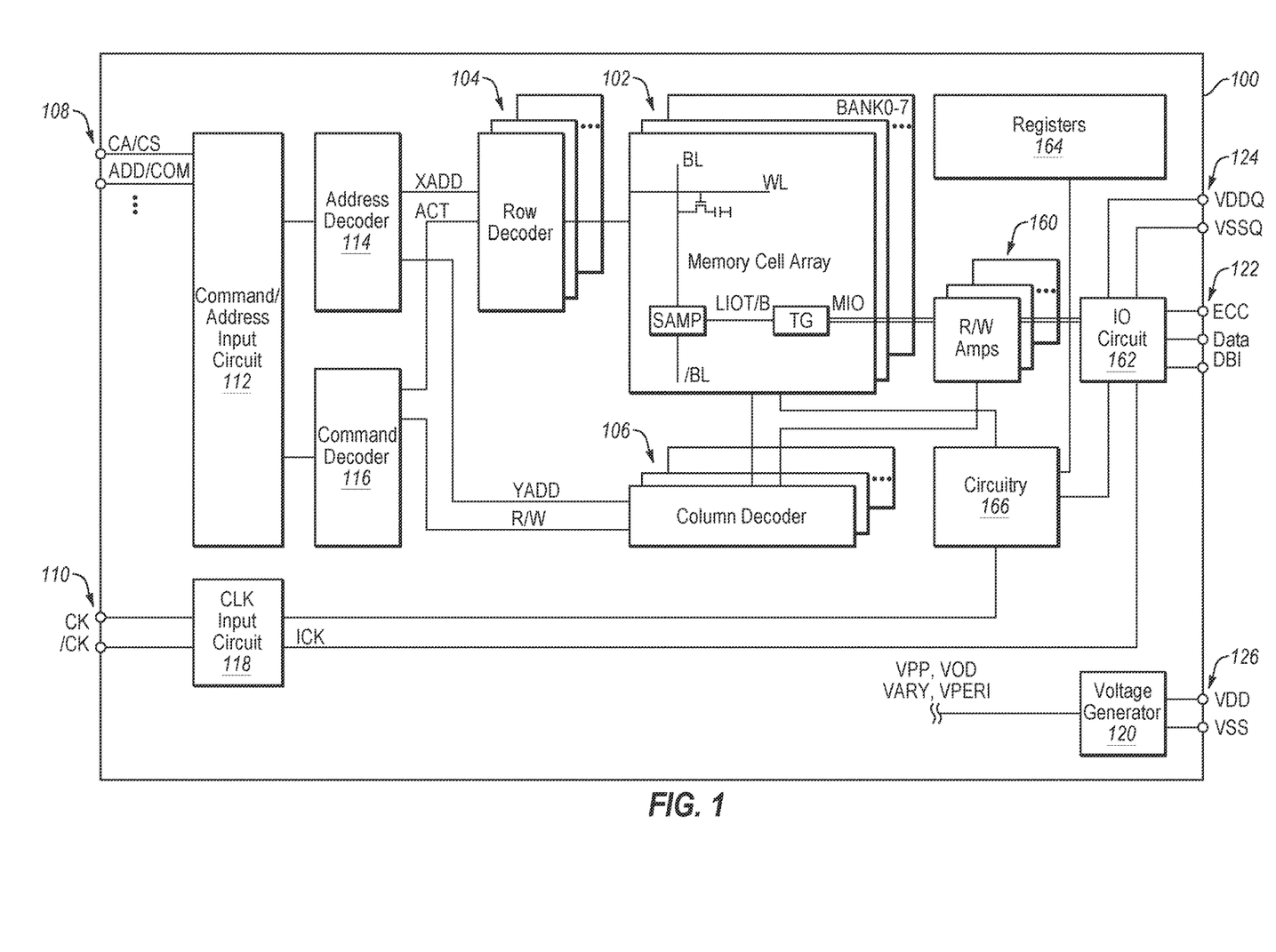
FIG. 1 is a functional block diagram of an example memory device, according to various embodiments of the present disclosure.

FIG. 1 is a functional block diagram illustrating an example memory device 100, in accordance with at least one embodiment of the present disclosure. Memory device 100 may include, for example, a DRAM (dynamic random access memory), a SRAM (static random access memory), a SDRAM (synchronous dynamic random access memory), a DDR SDRAM (double data rate SDRAM, such as a DDR4 SDRAM and the like), or a SGRAM (synchronous graphics random access memory). Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address and command terminals 108, clock terminals 110, and data terminals 122. Memory device 100 may include additional terminals such as a power supply terminal 124 and a power supply terminal 126, which may be coupled to a voltage generator 120.

During a contemplated operation, one or more command signals COM, received via address and command terminals 108, may be conveyed to a command decoder 116 via a command/address input circuit 112. Command decoder 116 may include a circuit configured to generate various internal commands via decoding the one or more command signals COM. Examples of the internal commands include an active command ACT and a read/write signal R/W.

Further, one or more address signals ADD, received via address and command terminals 108, may be conveyed to an address decoder 114 via command/address input circuit 112. Address decoder 114 may be configured to supply a row address XADD to row decoder 104 and a column address YADD to column decoder 106. Although command/address input circuit 112 is illustrated as a single circuit, in some embodiments, command/address input circuit 112 may comprise more than one circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to the read/write signal R/W, column decoder 106 may be activated, and the bit line BL specified by the column address YADD may be selected.

In response to active command ACT, a read signal, a row address XADD, and a column address YADD, data may be read from the memory cell MC specified by the row address XADD and the column address YADD. The read data may be output via sense amplifier SAMP, transfer gate TG, read/write amplifiers 160, an input/output circuit 162, and data terminals 122. Further, in response to active command ACT, a write signal, a row address XADD, and a column address YADD, write data may be supplied to memory cell array 102 via data terminals 122, input/output circuit 162, read/write amplifiers 160, transfer gate TG, and sense amplifier SAMP. The write data may be written to the memory cell MC specified by the row address XADD and the column address YADD.

Clock signals CK and /CK may be received via clock terminals 110. A clock input circuit 118 may generate internal clock signals ICK based on the clock signals CK and /CK. Internal clock signals ICK may be conveyed to various components of memory device 100, such as input/output circuit 162 (e.g., for controlling the operation timing of input/output circuit 162).

In addition, memory device 100 may include registers 164, which may include one or more registers (e.g., error registers, adjacency registers, adjacency units (i.e., as described more fully below), without limitation). For example, registers 164 may be used to stored error information (e.g., row addresses, adjacency information, without limitation) related to a testing operation (e.g., an mBIST), as described more fully herein.

Memory device 100 may further include circuitry 166 configured to carry out various embodiments of the present disclosure. For example, circuitry 166 may include one or more mBIST circuits (also referred to herein as "mBIST circuitry"), such as a test pattern generator, a test response analyzer, and/or other circuitry. Further, according to various embodiments, circuitry 166 may include one or more circuits described herein, such as at least a portion of circuitry 500 illustrated in FIG. 5 and/or at least a portion of circuitry 600 illustrated in FIG. 6. For example, at least a portion of registers 164 and/or at least a portion of circuitry 166 may be part of an mBIST core (e.g., of a DDR4 or DDR5 memory device).

Figure 2:
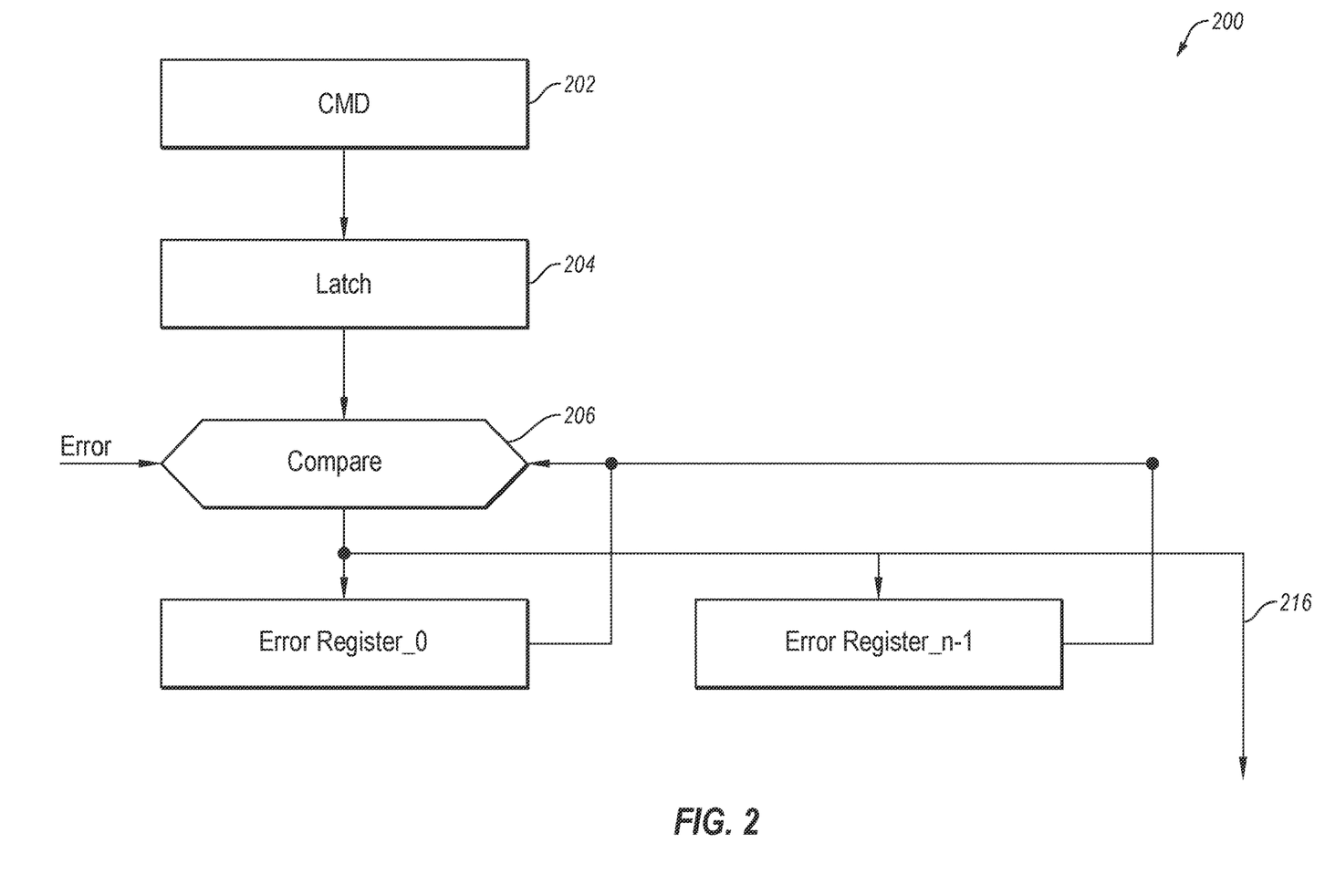
FIG. 2 is an example flow that may be used to detect and store row addresses in a testing operation.

FIG. 2 illustrates an example flow 200 that may be used to detect and store row addresses in a testing operation. For example, flow 200 may include or may be part of a memory built-in self-test (mBIST) operation. Flow 200 may begin at block 202, wherein an active command is detected, and flow 200 may proceed to block 204. At block 204, a current row address associated with the active command is identified (e.g., captured). Further, as will be appreciated, in response to an asserted error flag (i.e., in response to a fail associated with a testing operation (e.g., a read of previously written data)), at block 206, the current row address may be compared to row addresses stored in a number of error registers (Error Register_0-Error Register_n), and if the current row address is a new address (i.e., the current row address is not already stored in an error register), the current row address may be stored in an error register. Otherwise, if each error register is full, an OverFlow signal 216 may be asserted.

More specifically, if each of the number of error registers (Error Register_0-Error Register_n) is empty, the current row address, which is associated with an error flag, may be stored in an error register. Further, if at least one of the number of error registers includes a stored address, the current row address, which is associated with an error flag, may be compared to one or more stored row addresses, and if the current row address is new (i.e., the current row address is not already stored in an error register), the current row address may be stored in an error register. Furthermore, if each of the number of error registers includes a stored address (i.e., all error registers are full) and the current row address is new (i.e., the current row address is not already stored in an error register), OverFlow signal 216 may be asserted.

Further, each row address stored in an error register may be repaired (i.e., during a repair operation). For example, each row associated with a row address stored in an error register may be replaced with a redundant row, as will be appreciated by a person having ordinary skill in the art. Further, as will also be appreciated, additional testing (e.g., another mBIST operation) may be required in response to an asserted OverFlow signal 216.

Figure 3:
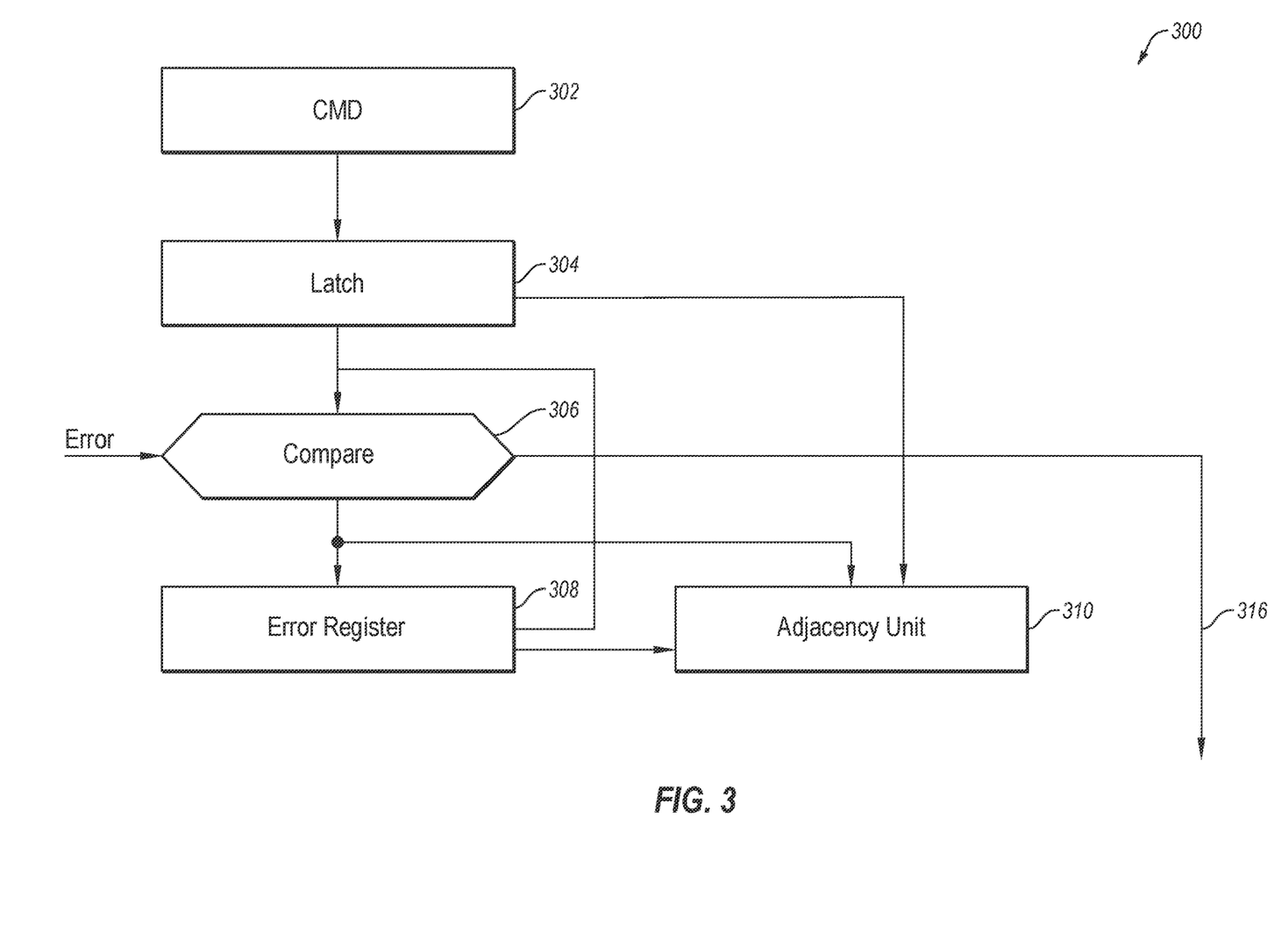
FIG. 3 is another example flow that may be used to detect and store row addresses and process adjacency information in a testing operation, in accordance with various embodiments of the present disclosure.

FIG. 3 depicts another example flow 300 that may be used to detect and store row addresses (i.e., associated with one or more errors) and process adjacency information, in accordance with various embodiments of the present disclosure. For example, at least a portion of flow 300 may include and/or may be part of a testing operation, such as, for example only, a memory built in self-test (mBIST). It is noted that although only one error register (i.e., error register 308) is shown in FIG. 3, a device (e.g., a memory device) may include a number of error registers (e.g., Error Register_0-Error Register_n as shown in FIG. 2). Further, each error register of the device may be associated with an adjacency unit 310. Thus, as will be appreciated, an associated device may include a number of (e.g., n–1) error registers and a number of (e.g., n–1) adjacency units, wherein each error register 308 is configured to convey a row address (i.e., a stored row address) to an associated adjacency unit 310.

Flow 300 may begin at block 302, wherein an active command is detected, and flow 300 may proceed to block 304. At block 304, a current row address associated with the active command is identified (e.g., captured). Further, as will be appreciated, in response to an asserted error flag (i.e., in response to a fail associated with a testing operation (e.g., a read of previously written data)), at block 306, the current row address may be compared to row addresses stored in error registers 308, and if the current row address is a new row address (i.e., the current row address is not already stored in an error register) the current row address may be stored in an error register. Otherwise, if each error register is full, an OverFlow signal 316 may be asserted.

More specifically, similarly to flow 200 of FIG. 2, if each error register 308 is empty, the current row address, which is associated with an error flag, may be stored in an error register. Further, if at least one of the number of error registers includes a stored address, the current row address, which is associated with an error flag, may be compared to one or more stored row addresses, and if the current row address is new (i.e., the current row address is not already stored in an error register), the current row address may be stored in an error register. Furthermore, if each error register 308 includes a stored address (i.e., error registers 308 are full) and the current row address is new (i.e., the current row address is not already stored in an error register), OverFlow signal 316 may be asserted. Further, each address stored in an error register may be repaired (i.e., during a repair operation). As will be appreciated, additional testing (e.g., another mBIST operation) may be required in response to an asserted OverFlow signal 316.

Moreover, for each row address determined to be associated with an error, an associated adjacency unit 310 may be populated (i.e., to store adjacency information). More specifically, a row address (i.e., a failed row address) may be conveyed from error register 308 to an associated adjacency unit 310, which may be configured to identify and generate a number (e.g., a group) of rows addresses (e.g., three row addresses) that are adjacent to or near the failed row address. For example, the group of generated row addresses may include a +1 row address (i.e., a row address immediately adjacent the failed row address), a +2 row address (i.e., a row address immediately adjacent the +1 row) address, and +3 row address (i.e., a row address immediately adjacent the +2 row address). Further, a subsequent failing row address may be compared (i.e., via adjacency unit 310) to each of the group of generated row addresses to determine if a number (e.g., 2, 3, or 4) of rows (i.e., rows adjacent to the failed row) have failed. As one example, adjacency unit 310 may be configured to indicate whether a threshold number of row addresses (e.g., a +1 row address, a +2 row address, and a +3 row address) of a set of rows adjacent the failed row have also failed.

As will be appreciated by a person having ordinary skill in the art, failing of a number of adjacent rows of a memory array may suggest a column failure. Thus, according to at least some embodiments, if a certain number (e.g., three, four, five, etc.) of adjacent rows (i.e., of a memory array) have failed, a flag (e.g., an unrepairable flag) may be asserted to identify an associated die as being unrepairable with row redundancy.

Figure 4A:
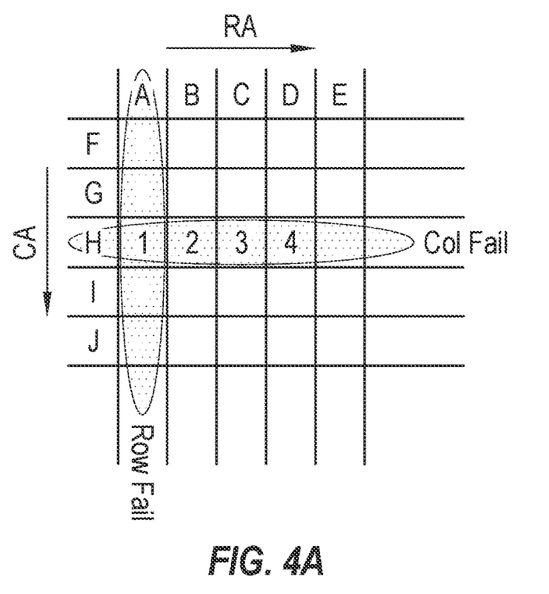
FIG. 4A depicts an example array including a number of rows and columns and depicting a number of fails, in accordance with various embodiments of the present disclosure.
Figure 4B:
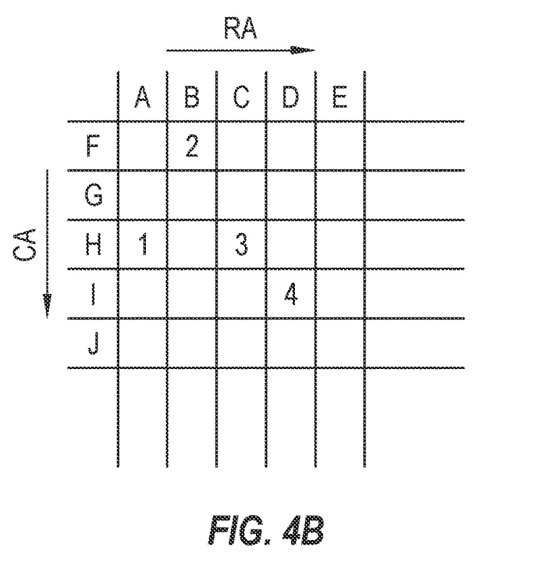
FIG. 4B depicts another example array including a number of rows and columns and depicting a number of fails, according to various embodiments of the present disclosure.

FIGS. 4A and 4B depict memory arrays including a number of rows A-E, wherein each row includes a row address RA. The memory arrays further include a number of columns F-J, wherein each column has a column address CA. With reference to FIG. 4A, a first contemplated testing operation will now be described. In this example, a first error is detected, wherein the first error is associated with fail of row address A. It is noted that in this example, the first error is associated with column address H. Further, in this example, row address A may be stored in an error register (e.g., error register 308 of FIG. 3), and a group of rows adjacent to and/or near row A may be identified and stored in an associated adjacency unit (adjacency unit 310 of FIG. 3). For example, a +1 row address (i.e., a row address immediately adjacent row address A (i.e., row B)), a +2 row address (i.e., a row address immediately adjacent the +1 row address (i.e., row address C)), and +3 row address (i.e., a row address immediately adjacent the +2 row address (i.e., row D)) may be stored in the associated adjacency unit 310.

Continuing with the example shown in FIG. 4A, a second error "2" is detected, wherein the second error is associated with a fail of row address B. It is noted that in this example, the second error is associated with column address H. Furthermore, third "3" and fourth "4" errors are detected, wherein the third and fourth errors are associated with a fail of row address C and a fail of row address D, respectively. It is noted that in this example, the third and fourth errors are also associated with column address H.

According to various embodiments, because a number (i.e., four (4) in this example) of adjacent row addresses have failed (i.e., in the example shown in FIG. 4A), a column failure may be detected and, in some embodiments, a flag (e.g., an unrepairable flag) may be asserted to identify an associated die as being unrepairable.

In the example shown in FIG. 4A, adjacent rows failed, and a failure of each row was associated with the same column (i.e., column H). However, according to at least some embodiments, it may not be necessary for failures of adjacent rows to be associated with a single column to result in an unrepairable flag. For example, with reference to FIG. 4B, a second contemplated testing operation will now be described. In this example, a first error is detected, wherein the first error is associated with a fail of row address A. It is noted that in this example, the first error is associated with column address H. Further, in this example, row address A may be stored in an error register (e.g., error register 308 of FIG. 3), and a number of rows adjacent to and/or near row A may be stored in an associated adjacency unit (adjacency unit 310 of FIG. 3). For example, a +1 row address (i.e., a row address immediately adjacent row A (i.e., row B)), a +2 row address (i.e., a row address immediately adjacent the +1 row address (i.e., row C)), and +3 row address (i.e., a row address immediately adjacent the +2 row address (i.e., row D)) may be stored in the associated adjacency unit 310.

Continuing with the example shown in FIG. 4B, a second error "2" is detected, wherein the second error is associated with a fail of row address B. It is noted that in this example, the second error is associated with column address F. Furthermore, third "3" and fourth "4" errors are detected, wherein the third and fourth errors are associated with a fail of row address C and a fail of row address D, respectively. It is noted that in this example, the third error is associated with column address H, and a fourth error is associated with column address I. In this example, because a number of adjacent row addresses have failed, a column failure may be identified and, in at least some embodiments, a flag (e.g., an unrepairable flag) may be asserted to identify an associated die as being unrepairable. It is noted that in the example in FIG. 4B, the identified column failure may not be a true column failure (i.e., because the detected fails are not associated with a common column). As will be appreciated, an error rate during a BIST test is relatively low, and thus the scenario in FIG. 4A may be more likely that the scenario in FIG. 4B.

Figure 5:
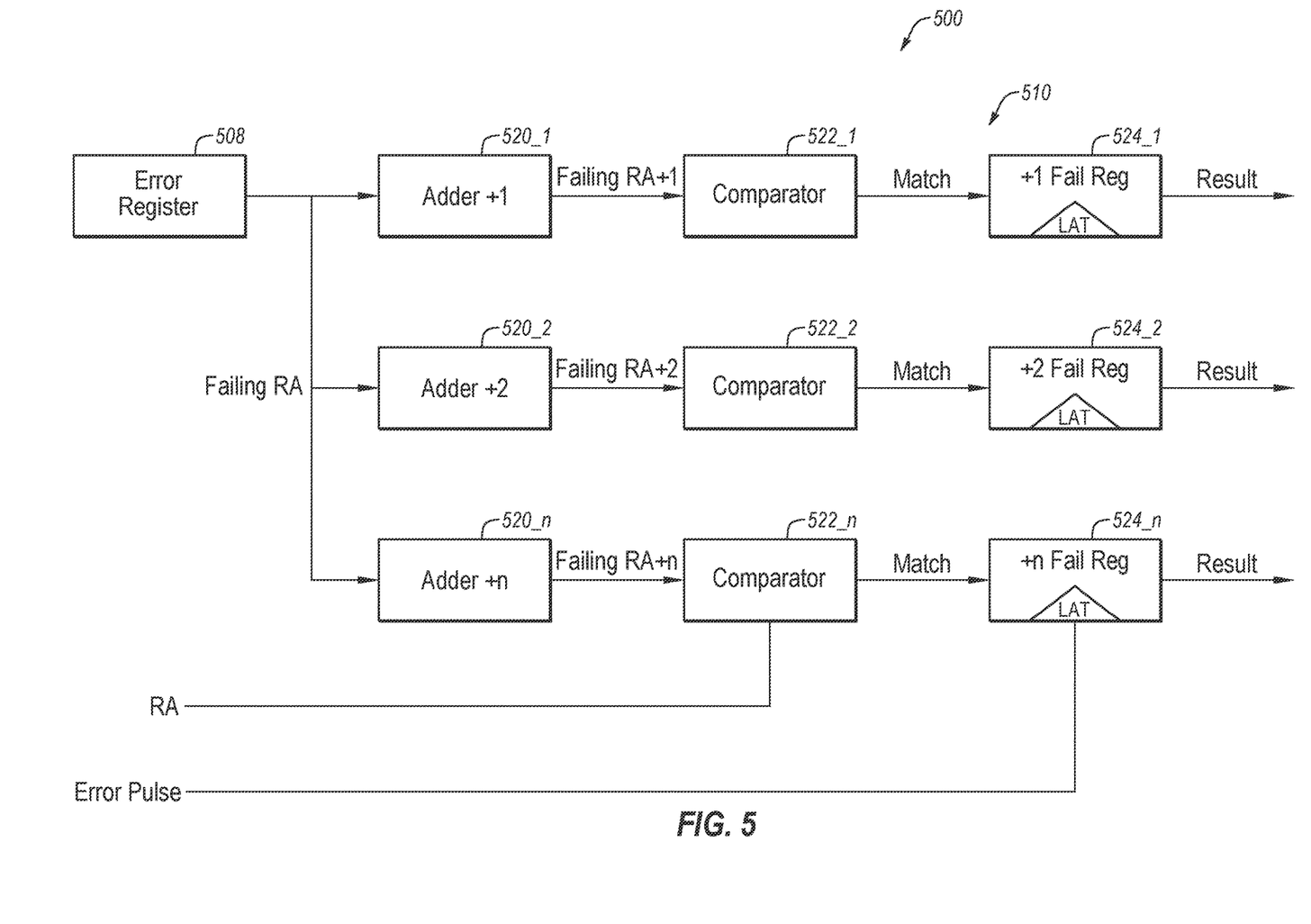
FIG. 5 illustrates example circuitry including an error register and an adjacency unit, in accordance with various embodiments of the present disclosure.

FIG. 5 illustrates example circuitry 500 including an error register 508 and an adjacency unit 510, in accordance with various embodiments of the present disclosure. For example, error register 508 may include error register 308 of FIG. 3. Further, for example, adjacency unit 510 may include adjacency unit 310 of FIG. 3.

Adjacency unit 510 includes a number of adders 520_1-520_n, a number of comparators 522_1-522_n, and a number of fail registers 524_1-524_n. As shown in FIG. 5, fail register 524_1 may be a +1 fail register, fail register 524_2 may be a +2 fail register, and fail register 524_n may be a +n fail register. Each adder 520 of adjacency unit 510 is configured to receive a row address (i.e., a failing row address) from error register 508 (i.e., the row address stored in error register 508) and add a value (e.g., 1, 2, 3, . . . n) to the received row address. For example, if adder 520_1 receive row address "1," adder 520_1 may output row address "2." As another example, if adder 520_2 receive row address "1," adder 520_2 may output row address "3."

Further, each comparator 522 of adjacency unit 510 is configured to receive a row address RA (i.e., a row address under test (a "current row address" or a "current testing row address")) and a row address from an associated adder 520. Comparator 522 may further be configured to compare the row address from an associated adder 520 to row address RA, and generate an asserted match signal (e.g., a HIGH signal) if the row address from the associated adder 520 matches row address RA. The asserted match signal may be conveyed to fail register 524.

Further, in response to an error pulse (i.e., associated with a current read operation), each fail register 524 may generate a result indicative of whether or not the fail register received an asserted match signal from an associated comparator. For example, if, during the testing operation, each fail register 524 received an asserted match signal, then each fail register 524 may generate (e.g., in response to error pulse signals) a signal indicative of a fail.

According to various embodiments, if a number (e.g., 3, 4, or 5, or more or less) of fail registers 524 output a signal indicating a number of adjacent row address fails, a flag (e.g., an unrepairable flag) may be asserted to identify an associated die as being unrepairable. For example, if "n" is equal to three (3), and, during a testing operation, each of fail register 524_1, fail register 524_2, and fail register 524_n generate an output indicating a fail, then it may be determined that four (4) adjacent rows include failures (e.g., which may indicate a column failure) and thus, a flag (e.g., an unrepairable flag) may be asserted to identify an associated die as being unrepairable.

A more detailed example will now be described with reference to FIGS. 4A, 4B, and 5. In this example, "n" is considered to be equal to three (3). Further, in this example, error register 508 includes a stored row address of "1" (i.e., as a result of a previous fail), which is conveyed to adders 520_1-520_n. In this example, upon receipt of row address "1," adder 520_1 conveys "2" to comparator 522_1, adder 520_2 conveys "3" to comparator 522_2, and adder 520_n conveys "4" to comparator 522_n.

Moreover, in this example, row address "2" is tested, and thus row address RA "2" is conveyed to comparators 522. In this example, because comparator 522_1 received "2" from adder 520_1, comparator 522_1 outputs a signal (e.g., a high signal) indicative of a match. Further, continuing with in this example, subsequently, row address "3" is tested, and thus row address RA "3" is conveyed to comparators 522. In this example, because comparator 522_2 received "3" from adder 520_2, comparator 522_2 outputs a signal (e.g., a high signal) indicative of a match. Continuing with the example, subsequently, row address "4" also its tested, and thus row address RA "4" is conveyed to comparators 522. In this example, because comparator 522_n received "4" from adder 520_n, comparator 522_n outputs a signal (e.g., a high signal) indicative of a match.

As will be appreciated, in this example, each of fail register 524_1, fail register 524_2, and fail register 524_n may generate a signal indicating a fail, and thus, four adjacent rows have failed (e.g., which may indicate a column failure). Accordingly, in this example, a flag (e.g., an unrepairable flag) may be asserted to identify an associated die as being unrepairable.

Figure 6:
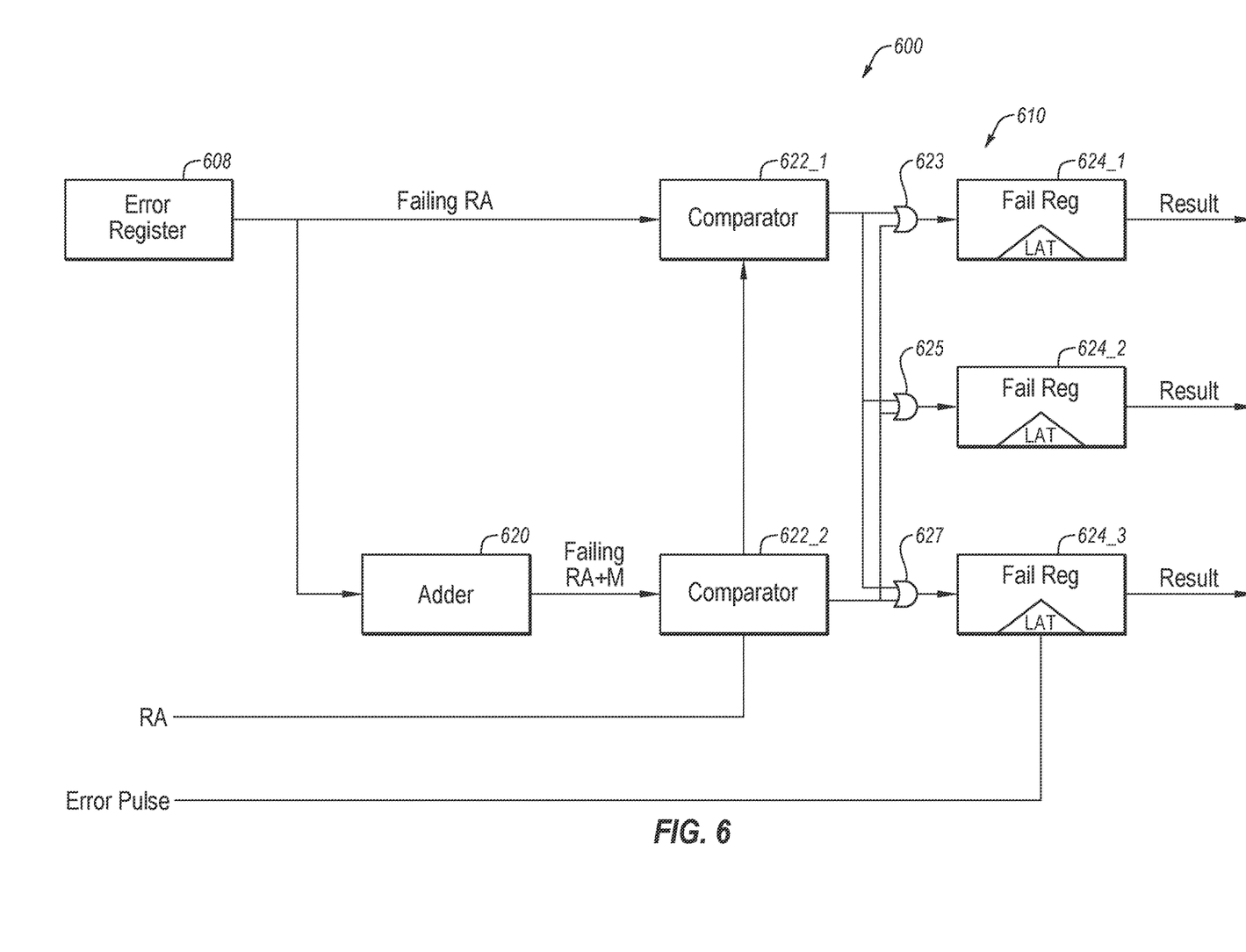
FIG. 6 illustrates other example circuitry including an error register and an adjacency unit, according to various embodiments of the present disclosure.

FIG. 6 illustrates other example circuitry 600 including an error register 608 and an adjacency unit 610, in accordance with various embodiments of the present disclosure. For example, error register 608 may include error register 308 of FIG. 3. Further, for example, adjacency unit 610 may include adjacency unit 310 of FIG. 3. Generally, adjacency unit 610 is configured to receive a row address from error register 608 and generate a group (also referred to herein as a "set") of addresses based on the row address from error register 608. More specifically, in one example, adjacency unit 610 receives the row address from error register 608 and identifies a group of six (6) addresses based on the received row address (i.e., +/−1 from the received row address, +/−2 from the received row address, +/−3 from the received row address). Further, adjacency unit 610 is configured to compare an incoming row address RA to each row address of the group of addresses (i.e., to determine whether a number (e.g., 3, 4, 5, 6, etc.) of adjacent rows have failed).

Figure 7:
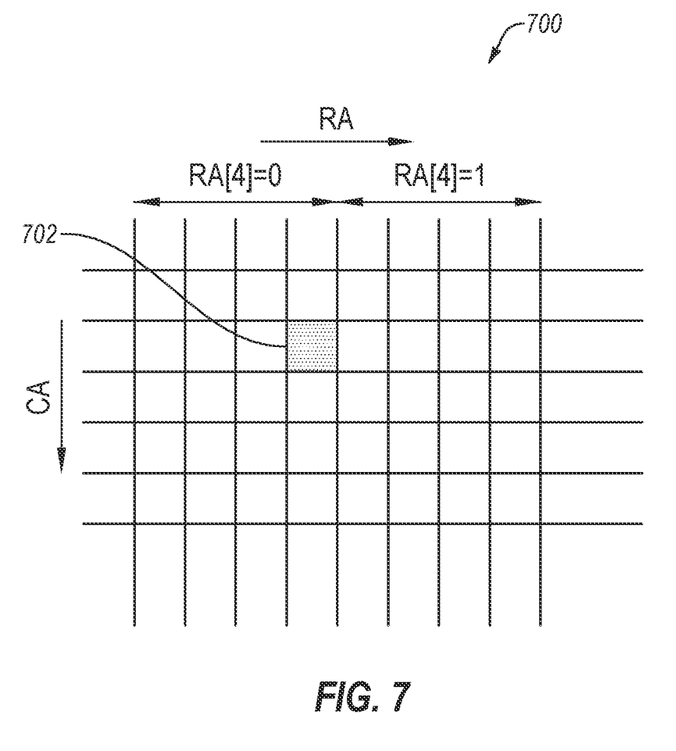
FIG. 7 depicts another example array including a number of rows and columns and depicting an error location, according to various embodiments of the present disclosure.

FIG. 7 depicts a memory array 700 including a number of rows, wherein each row includes a row address RA. Memory array 700 further includes a number of columns, wherein each column has a column address CA. As will be appreciated by a person having ordinary skill, in at least some implementations, a row repair may be four (4) word lines wide (i.e., four (4) word line redundancy may be used). Accordingly, in this example, memory array 700 is compressed (i.e., from to RA[16:0] to RA[16:2] (i.e., RA[1:0] are compressed)). It is noted that a first RA region (RA[4] =0) includes four rows, and a second RA region (RA[4]=1) includes four rows.

With reference again to FIG. 6, adjacency unit 610 includes an adder 620, comparators 622_1 and 622_2, OR gates 623, 625, and 627, and a number of fail registers 624_1-624_3. For example, fail register 624_1 may include a +/−1 fail register, fail register 624_2 may include a +/−2 fail register, and fail register 624_3 may include a +/−3 fail register.

Adder 620 of adjacency unit 610 is configured to receive a row address (i.e., a failing row address) from error register 608 (i.e., the row address stored in error register 608) and add a value (e.g., M) to the received row address. As noted above, in some examples, a memory array may be compressed (i.e., four (4) word line redundancy may be used). Thus, in at least these examples, adder 620 may be a "+16 adder," which may add four (4) to the failing row address to generate an incremented address. In other words, due to compression, "+16" may mean adding RA[4]=1. For example, if adder 620 receives row address "3" (i.e., "011" in binary), adder 620 may output row address "7" (i.e., "111" in binary). As another example, if adder 620 receives row address "1" (i.e., "001" in binary), adder 520_2 may output row address "5" (i.e., "101" in binary).

Comparator 622_1 is configured to receive the failing row address from error register 608. Further, in response to receipt of the failing row address, comparator 622_1 may identify a group of rows (e.g., three rows) that is adjacent to the failing row address. More specifically, with reference to FIGS. 6 and 7, comparator 622_1 may identify a group of rows (e.g., three rows) to the left of error location 702. In some embodiments, the row addresses (i.e., of an adjacent group of row addresses) may be determined by inverting RA[2] of the failing row address (i.e., to generate a first row address), inverting RA[3] of the failing row address (i.e., to generate a second row address), and inverting both RA[2] and RA[3] of the failing row address (i.e., to generate a third row address). More specifically, in the example wherein the failing row address is "011," by inverting RA[2] of "011," "010" may be generated, by inverting RA[3] of "011," "001" may be generated, and by inverting RA[2] and RA[3] of "011," "000" may be generated.

Moreover, comparator 622_1 is configured to receive a row address RA (i.e., a row address under test (a "current row address" or a "current testing row address")). Further, comparator 622_1 may compare each row of the adjacent group of rows to row address RA.

More specifically, in the example wherein the failing address from error register 608 is row address 3 ("011") (indicated by error location 702 in FIG. 7), comparator 622_1 identifies addresses "000," "001," and "010" (i.e., from region RA[4]=0 of FIG. 7) and compares each of the identified addresses (i.e., "000," "001," and "010" in this example) to row address RA. In another example wherein the failing address from error register 608 is row address 7 ("111"), comparator 622_1 identifies addresses "100," "101," and "110" (i.e., from region RA[4]=1 of FIG. 7) and compares each of the identified addresses to row address RA. In yet another example wherein the failing address from error register 608 is row address 0 ("000"), comparator 622_1 identifies addresses "001," "010," and "011" and compares each of the identified addresses to row address RA.

Further, comparator 622_1 may generate a signal (e.g., a three bit signal), which may include a HIGH bit in response to a match of row address RA to one of the identified rows of the adjacent group of rows (e.g., a group of rows to the left of error location 702 of FIG. 7). Otherwise, if a match does not exist, comparator 622_1 may generate a second signal without a HIGH bit.

Comparator 622_2 is configured to receive a signal from adder 620. Further, in response to receipt of the signal from adder 620, comparator 622_2 may identify a group of rows (e.g., three rows) that is adjacent to the failing row address. More specifically, with reference to FIGS. 6 and 7, comparator 622_2 may identify a group of rows (e.g., three rows) to the right of error location 702. As noted above, in some embodiments, the row addresses (i.e., of an adjacent group of row addresses) by determined by inverting RA[2] of the failing row address (i.e., to generate a first row address), inverting RA[3] of the failing row address (i.e., to generate a second row address), and inverting both RA[2] and RA[3] of the failing row address (i.e., to generate a first row address). More specifically, in the example wherein the output of adder 620 is "111," by inverting RA[2] of "111," "110" may be generated, by inverting RA[3] of "111," "101" may be generated, and by inverting both RA[2] and RA[3] of "111," "100" may be generated.

Moreover, comparator 622_2 is configured to receive row address RA (i.e., a row address under test (a "current row address" or a "current testing row address")), and comparator 622_2 may compare each row of the adjacent group of rows to row address RA.

More specifically, in the example wherein the failing address from error register 608 is row address 3 ("011") (indicated by error location 702 in FIG. 7), comparator 622_2 identifies addresses "100," "101," and "110" (i.e., from region RA[4]=1 of FIG. 7) and compares each of the identified addresses (i.e., "100," "101," and "110" in this example) to row address RA. In another example wherein the failing address from error register 608 is row address 7 ("111"), comparator 622_2 identifies addresses "000," "001," and "010" and compares each of the identified addresses to row address RA. It is noted that in some examples an upper term may be incremented by adder 620. For example, if failing row address is 7, RA[5] term is 0 (RA[5:2]="0111"). Therefore, an output of adder 620 may be 1011. It is further noted that RA[5] is not shown in memory array 700. In yet another example wherein the failing address from error register 608 is row address 0 ("000"), comparator 622_2 identifies addresses "101," "110," and "111" and compares each of the identified addresses to row address RA.

Further, comparator 622_2 may generate a signal (e.g., a three bit signal), which may include a high bit in response to a match of row address RA to one of the identified rows of the adjacent group of rows (e.g., to the right of error location 702 of FIG. 7). Otherwise, if a match does not exist, comparator 622_2 may generate a second signal without a high bit.

Each of OR gates 623, 625, and 627 is configured to receive one bit from each of the signals output from comparator 622_1 and comparator 622_2. More specifically, for example, OR gate 623 receives the compare result of RA[2] inversion from comparator 622_1 and comparator 622_2, OR gate 625 receives the compare result of RA[3] inversion from comparator 622_1 and comparator 622_2, and OR gate 627 receives the compare result of RA[2] and RA[3] inversion from comparator 622_1 and comparator 622_2. If at least one bit received at an OR gate is HIGH, the OR gate may generate a HIGH signal, which may be latched in the associated fail register 624. Further, in response to an error pulse (i.e., associated with a current read operation), each fail register 624 may generate a result indicative of the signal received from the associated OR gate. It is noted that fail register 624 may hold a fail result throughout a testing operation. In one example, if each fail register 624 generates a HIGH result (i.e., during a testing operation), a column failure may be detected. Further, in response to a column failure, an unrepairable flag may be asserted.

As will be appreciated, various circuits of circuitry 500 of FIG. 5 and circuitry 600 of FIG. 6 may be implemented via any suitable circuitry. For example, each comparator of circuitry 500 and/or circuitry 600 may be implemented via a number of AND gates, OR gates, NAND gates, NOR gates, inverters, latches, flip-flops, registers, other logic circuitry, and/or any combination thereof.

Figure 8:
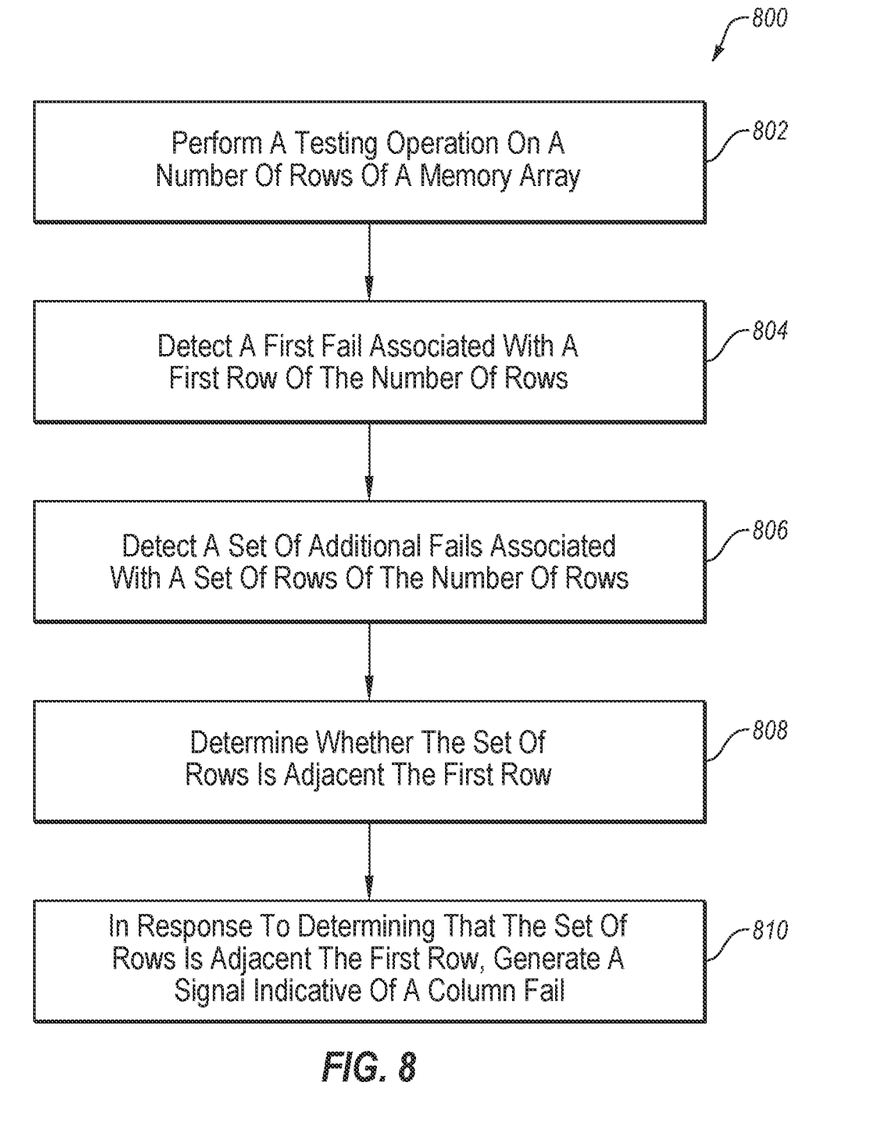
FIG. 8 is a flowchart illustrating an example method of testing a microelectronic device, according to various embodiments of the present disclosure.

FIG. 8 is a flowchart of an example method 800 of operating a microelectronic device. Method 800 may be arranged in accordance with at least one embodiment described in the present disclosure. Method 800 may be performed, in some embodiments, by a device or system, such as memory device 100 of FIG. 1, circuitry 500 of FIG. 5, circuitry 600 of FIG. 6, memory system 900 of FIG. 9, electronic system 1000 of FIG. 10, or another device or system. Although illustrated as discrete blocks, various blocks may be divided into additional blocks, combined into fewer blocks, or eliminated, depending on the desired implementation.

Method 800 may begin at block 802, wherein a testing operation may be performed on a number of rows of a memory array, and method 800 may proceed to block 804. For example, the testing operation may be part of and/or include a built-in self-test (BIST) operation.

At block 804, a first fail associated with a first row of the number of rows may be detected, and method 800 may proceed to block 806. For example, the first fail, which may be detected in response to the testing operation, may be associated with row 3 (i.e., of row region RA[4]=0 of FIG. 7) of the memory array (e.g., as indicated by error location 702 of FIG. 7).

At block 806, a set of additional fails associated with a set of rows of the number of rows may be detected, and method 800 may proceed to block 808. For example, the set of additional fails, which may be detected in response to the testing operation, may include a number of additional fails (e.g., three additional fails).

At block 808, a determination may be made as to whether the set of rows (i.e., which are associated with the additional fails) is adjacent the first row, and method 800 may proceed to block 810. For example, via one or more comparators (e.g., of circuitry 500 of FIG. 5 and/or circuitry 600 of FIG. 6), row addresses of a group of rows adjacent the first row (e.g., three rows to the right of error location 702 and/or three rows to the left of error location 702) may be compared to row addresses of the set of rows associated with the set of additional fails.

At block 810, in response to determining that the set of rows is adjacent the first row, a signal indicative of a column failure may be generated. For example, in response to each fail register of a number of fail registers (e.g., fail registers 524 of FIG. 5 or fail registers 624 of FIG. 6) generating a signal indicative of a fail (i.e., a row address of a row adjacent the first row and a row address of the set of rows match and error pulse is fired), the signal indicative of the column failure may be generated.

Modifications, additions, or omissions may be made to method 800 without departing from the scope of the present disclosure. For example, the operations of method 800 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, method 800 may include an act of storing an address of the first row in an error register (e.g., error register 508 of FIG. 5 or error register 608 of FIG. 6) of a number of error registers. Further, for example, in various embodiments, method 800 may include one or more acts of determining the group of rows adjacent the first row (e.g., three rows to the right of error location 702 (see FIG. 7) and/or three rows to the left of error location 702). As yet another example, method 800 may include one or more acts including generating an unrepairable flag in response to the column failure.

As will be appreciated, various embodiments disclosed herein may detect most, if not all column failures (e.g., during a testing operation (e.g., an mBIST)) (e.g., run by a customer). In these embodiments, in response to detection of a column failure, an unrepairable flag may be generated. Thus, in these embodiments, a customer, for example, may receive an indication that an mBIST repair is not possible (i.e., and therefore the customer may not attempt a number of mBIST repairs on an unrepairable device).

A memory system is also disclosed. The memory system may include a number of memory devices. Each memory device may include one or more arrays (e.g., memory arrays) and one or more output drivers, as described herein.

Figure 9:
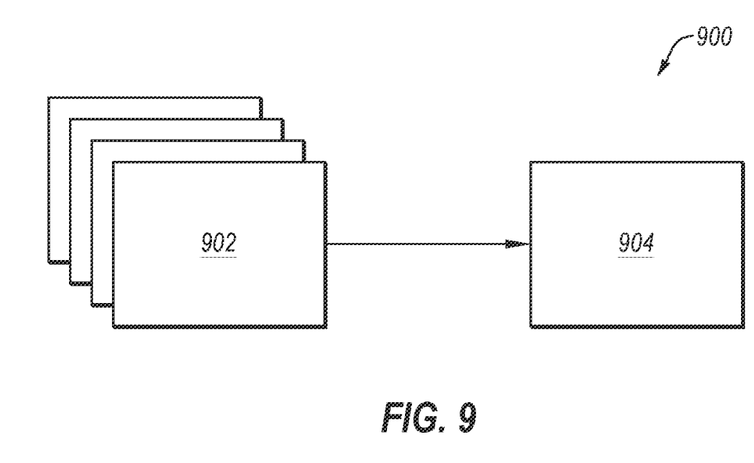
FIG. 9 is a simplified block diagram of an example memory system, according to one or more embodiments of the present disclosure.

FIG. 9 is a simplified block diagram of a memory system 900 implemented according to one or more embodiments described herein. Memory system 900 includes a number of memory devices 902 and a controller 904. For example, one or more of memory devices 902 may include circuitry, such as circuitry 500 of FIG. 6 and/or circuitry 600 of FIG. 6, as described herein.

Figure 10:
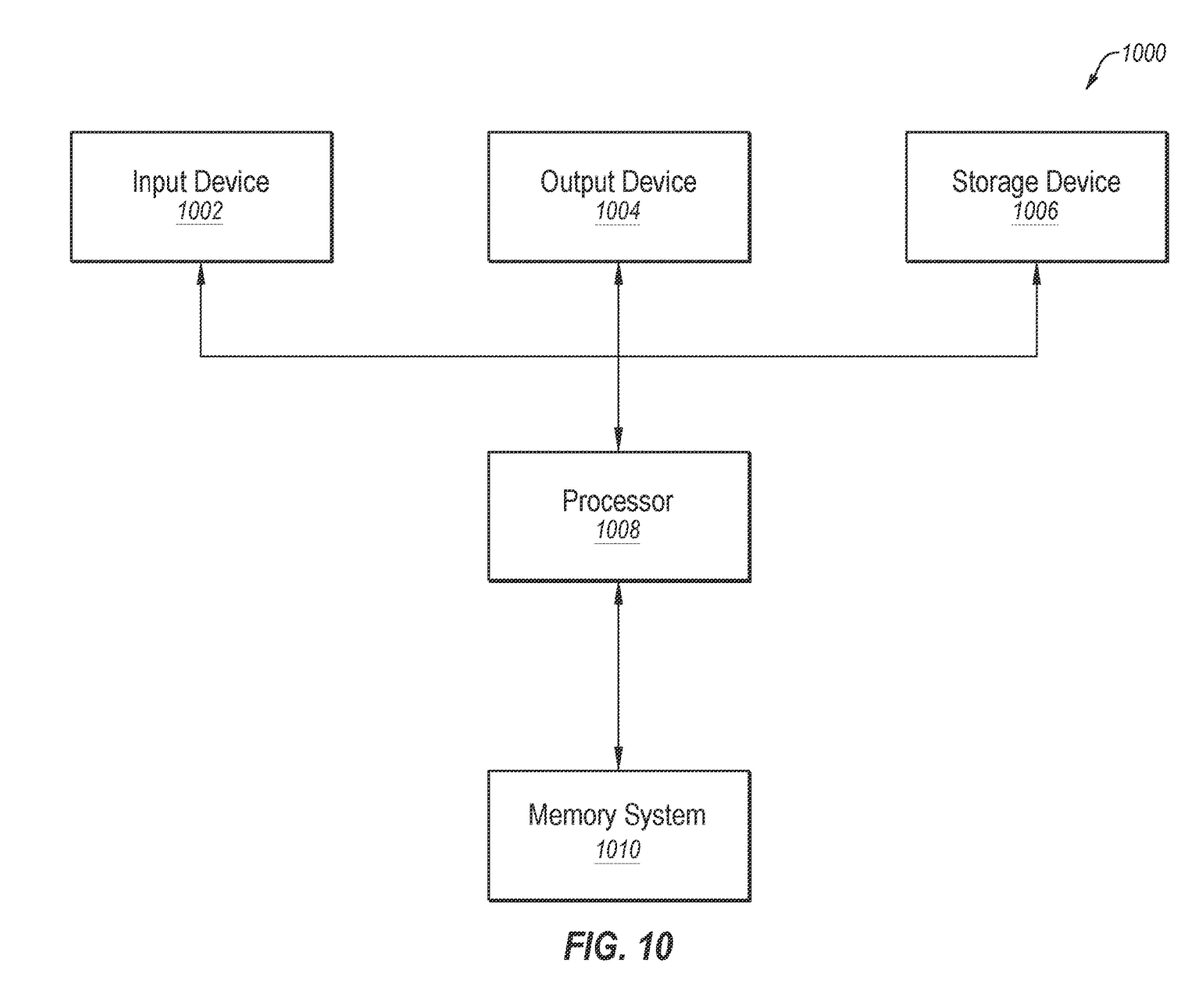
FIG. 10 is a simplified block diagram of an example electronic system, in accordance with one or more embodiments of the present disclosure.

An electronic system is also disclosed. The electronic system may include a memory system including a number of memory devices. FIG. 10 is a simplified block diagram of an electronic system 1000 implemented according to one or more embodiments described herein. Electronic system 1000 includes at least one input device 1002. Input device 1002 may be a keyboard, a mouse, or a touch screen. Electronic system 1000 further includes at least one output device 1004. Output device 1004 may be a monitor, touch screen, or speaker. Input device 1002 and output device 1004 are not necessarily separable from one another. Electronic system 1000 further includes a storage device 1006. Input device 1002, output device 1004, and storage device 1006 are coupled to a processor 1008.

Electronic system 1000 further includes a memory system 1010 coupled to processor 1008. Memory system 1010, which may include memory system 900 of FIG. 9, includes a number of memory devices (e.g., memory device 100 of FIG. 1). Electronic system 1000 may be include a computing, processing, industrial, or consumer product. For example, without limitation, electronic system 1000 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

One or more embodiments of the present disclosure include a device. The device may include a memory array including a number of rows and a number of columns. The memory device may further include circuitry coupled to the memory array. The circuitry may be configure to perform a testing operation on each row of the number of rows to detect: a first fail of a first row of the number of rows; and a set of additional fails associated with a set of rows of the number of rows. The circuitry may also be configured to determine whether the set of rows is adjacent the first row. Further, in response to determining that the set of rows is adjacent the first row, the circuitry may be configured to generate a signal indicative of a failure of a column of the number of columns.

Other embodiments of the present disclosure include a method. The method may include detecting a first fail associated with a first row of a number of rows of a memory array. The method may also include detecting a set of additional fails associated with a set of rows of the number of rows; determining whether the set of rows is adjacent the first row. Moreover, the method may include, in response to determining that the set of rows is adjacent the first row, generating a signal indicative of a column failure.

Additional embodiments of the present disclosure include an electronic system. The electronic system may include at least one input device, at least one output device, at least one processor device operably coupled to the input device and the output device; and at least one memory system operably coupled to the at least one processor device. The memory system may include a memory device. The memory device may include a memory array, and testing circuitry coupled to the memory array. The testing circuitry may be configured to detect a first failing row address and detect a set of at least two additional failing row addresses. Further, the testing circuitry may be configured to determine whether the set of at least two additional failing row addresses is adjacent the first failing row address. The testing circuitry may also be configured to generate a signal indicative of column failure in response to determining that the set of at least two additional failing row addresses is adjacent the first failing row address.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
  a memory array including a number of rows and a number of columns; and
  circuitry coupled to the memory array and configured to:
    perform a testing operation on each row of the number of rows to detect: a first fail of a first row of the number of rows; and a set of additional fails associated with a set of rows of the number of rows;
    determine whether the set of rows is adjacent the first row; and
    in response to determining that the set of rows is adjacent the first row, generate a signal indicative of a failure of a column of the number of columns.

2. The device of claim 1, wherein the circuitry is further configured to determine a group of rows adjacent the first row, wherein the group of rows comprises a number of rows on a first side of the first row, a number of rows on a second, opposite side of the first row, or both.

3. The device of claim 2, wherein the circuitry is further configured to compare each row of the set of rows to each row of the group of rows to determine whether the set of rows is adjacent the first row.

4. The device of claim 1, wherein the circuitry comprises:
  a number of first registers, each first register configured to store a row address for a row that fails a testing operation; and
  a number of adjacency units, where each first register of the number of first registers is coupled to an associated adjacency unit of the number of adjacency units, wherein at least one adjacency unit of the number of adjacency units is configured to:
    receive, from an associated first register, an address associated with the first fail;
    determine at least one address of a group of rows adjacent the failed row;
    receive an address associated with a second fail of the set of additional fails;
    compare the at least one address of the group of rows adjacent the failed row to the address associated with the second fail; and
    generate the signal indicative of the failure of the column in response to the at least one address of the group of rows adjacent the failed row matching the address associated with the second fail.

5. The device of claim 4, where the at least one adjacency unit comprises:
  a number of adders, each adder of the number of adders configured to:
    receive the address associated with the first row; and
    generate the at least one address of the group of rows adjacent the first row;
  a number of comparators, each comparator of the number of comparators configured to:
    receive the at least one address of the group of rows adjacent the first row;
    receive the address associated with the second fail of the set of additional fails;
    compare the at least one address of the group of rows adjacent the failed row to the address associated with the second fail; and
    generate a match signal in response to the at least one address of the group of rows adjacent the failed row matching the address associated with the second fail; and
  a number of fail registers, each fail register of the number of fail registers configured to:
    receive the match signal from at least one comparator of the number of comparators; and
    generate an output indicative of a match in response to receipt of an error pulse signal.

6. The device of claim 1, wherein the circuitry comprises:
  a number of first registers, a register of the number of first registers configured to store a row address of the first row;
  at least one adder configured to receive the address of the first row and generate an incremented address; and
  at least one comparator configured to:
    identify at least one group of rows adjacent the first row;
    receive an address associated with a current row;
    compare the address associated with the current row to an address of a row of the at least one group of rows adjacent the first row; and
    generate a signal in response to the address of the row of the at least one group of rows adjacent the first row matching the address associated with the current row.

7. The device of claim 6, further comprising at least one fail register, each fail register of the at least one fail register coupled to an output of a comparator of the at least one comparator each fail register configured to store a fail flag in response to identification of an error found while testing a row of the at least one group of rows adjacent the first row.

8. The device of claim 1, wherein the testing operation comprises a memory built-in self-test (mBIST).

9. A method, comprising:
  detecting a first fail associated with a first row of a number of rows of a memory array;
  detecting a set of additional fails associated with a set of rows of the number of rows;
  determining whether the set of rows is adjacent the first row; and
  in response to determining that the set of rows is adjacent the first row, generating a signal indicative of a column failure.

10. The method of claim 9, wherein detecting the set of additional fails comprises detecting at least three additional fails associated with at least three additional row of the set of rows.

11. The method of claim 9, further comprising storing an address of the first row in a first error register of a number of error registers.

12. The method of claim 9, further comprising determining a group of rows adjacent to the first row.

13. The method of claim 12, wherein determining whether the set of rows is adjacent the first row comprises determining whether the set of rows is adjacent the first row based on a comparison of the group of rows adjacent the first row to each row of the set of rows.

14. The method of claim 12, wherein determining whether the set of rows is adjacent the first row comprises comparing each row of the group of rows to each row of the set of rows.

15. The method of claim 9, further comprising perform a built-in self-test (BIST) operation to detect the first fail and the set of additional fails.

16. The method of claim 9, further comprising generating an unrepairable flag in response to the column failure.

17. A system, comprising:
- at least one input device;
- at least one output device;
- at least one processor device operably coupled to the input device and the output device; and
- at least one memory system operably coupled to the at least one processor device, the memory system comprising:
  - a memory device including a memory array; and
  - testing circuitry coupled to the memory array and configured to:
    - detect a first failing row address;
    - detect a set of at least two additional failing row addresses;
    - determine whether the set of at least two additional failing row addresses is adjacent the first failing row address; and
    - generate a signal indicative of column failure in response to determining that the set of at least two additional failing row addresses is adjacent the first failing row address.

18. The system of claim 17, wherein the testing circuitry comprises:
- an error register configured to store the first failing row address; and
- an adjacency unit configured to:
  - receive the first failing row address;
  - determine at least two address of a group of addresses adjacent the first failing row address; and
  - generate the signal indicative of the column failure responsive to each of at least two addresses of the group of addresses adjacent the row address matching at least one address of the set of at least two additional failing row addresses.

19. The system of claim 17, wherein the testing circuitry comprises built-in self-test (BIST) circuitry.

20. The system of claim 17, wherein the memory device is configured to generate an unrepairable flag in response to the column failure.

* * * * *